United States Patent [19]
Stella et al.

[11] 4,097,858
[45] Jun. 27, 1978

[54] DIGITAL TO ANALOG RESOLVER CONVERTER

[75] Inventors: Carl Stella, Valencia, Calif.; David Julian Simon, Saddle Brook, N.J.

[73] Assignee: The Singer Company, Little Falls, N.J.

[21] Appl. No.: 620,740

[22] Filed: Oct. 8, 1975

[51] Int. Cl.² .................................. H03K 13/02
[52] U.S. Cl. .................. 340/347 SY; 340/347 M; 340/347 DA; 318/600; 364/608
[58] Field of Search .... 340/347 SY, 347 M, 347 AD, 340/347 DA; 235/197, 186, 150.53; 318/600

[56] References Cited

U.S. PATENT DOCUMENTS

| | | | |
|---|---|---|---|
| 3,295,125 | 12/1966 | Idelsohn et al. | 340/347 SY |
| 3,335,417 | 8/1967 | Adler et al. | 340/347 SY |
| 3,662,379 | 5/1972 | Miller et al. | 340/347 SY X |
| 3,668,693 | 6/1972 | Eaton et al. | 340/347 SY |
| 3,675,234 | 7/1972 | Metz | 340/347 DA |
| 3,696,407 | 10/1972 | Egerton | 340/347 SY |
| 3,713,141 | 1/1973 | Higgins et al. | 340/347 SY |
| 3,987,434 | 10/1976 | Endo et al. | 340/347 SY |

*Primary Examiner*—Thomas J. Sloyan
*Attorney, Agent, or Firm*—Thomas W. Kennedy

[57] ABSTRACT

A digital to analog resolver converter uses a digital to analog converter to convert a part of the digital input to a corresponding analog angle value. This analog angle value is applied to sine and cosine function generators which use bits of the digital input signal to select slope and intercept values for approximating the sine and cosine of the analog angle value. The outputs of these function generators are applied to an octant select circuit, which chooses the values to be used as the sine and cosine of the angle in a particular octant. Two circuits then assign the proper sign to the cosine and sine function values.

10 Claims, 6 Drawing Figures

OCTANT 1

OCTANT 4

| OCTANT | FUNCTION | FUNCTION GENERATOR OUTPUT USED TO APPROXIMATE SINE | FUNCTION GENERATOR OUTPUT USED TO APPROXIMATE COSINE | SIGN OF SINE | SIGN OF COSINE |
|---|---|---|---|---|---|
| I | NOT COMPLEMENTED | SINE FUNCTION GENERATOR | COSINE FUNCTION GENERATOR | POSITIVE | POSITIVE |
| II | COMPLEMENTED | COSINE FUNCTION GENERATOR | SINE FUNCTION GENERATOR | POSITIVE | POSITIVE |
| III | NOT COMPLEMENTED | COSINE FUNCTION GENERATOR | SINE FUNCTION GENERATOR | POSITIVE | NEGATIVE |
| IV | COMPLEMENTED | SINE FUNCTION GENERATOR | COSINE FUNCTION GENERATOR | POSITIVE | NEGATIVE |
| V | NOT COMPLEMENTED | SINE FUNCTION GENERATOR | COSINE FUNCTION GENERATOR | NEGATIVE | NEGATIVE |
| VI | COMPLEMENTED | COSINE FUNCTION GENERATOR | SINE FUNCTION GENERATOR | NEGATIVE | NEGATIVE |
| VII | NOT COMPLEMENTED | COSINE FUNCTION GENERATOR | SINE FUNCTION GENERATOR | NEGATIVE | POSITIVE |
| VIII | COMPLEMENTED | SINE FUNCTION GENERATOR | COSINE FUNCTION GENERATOR | NEGATIVE | POSITIVE |

FIG. 2

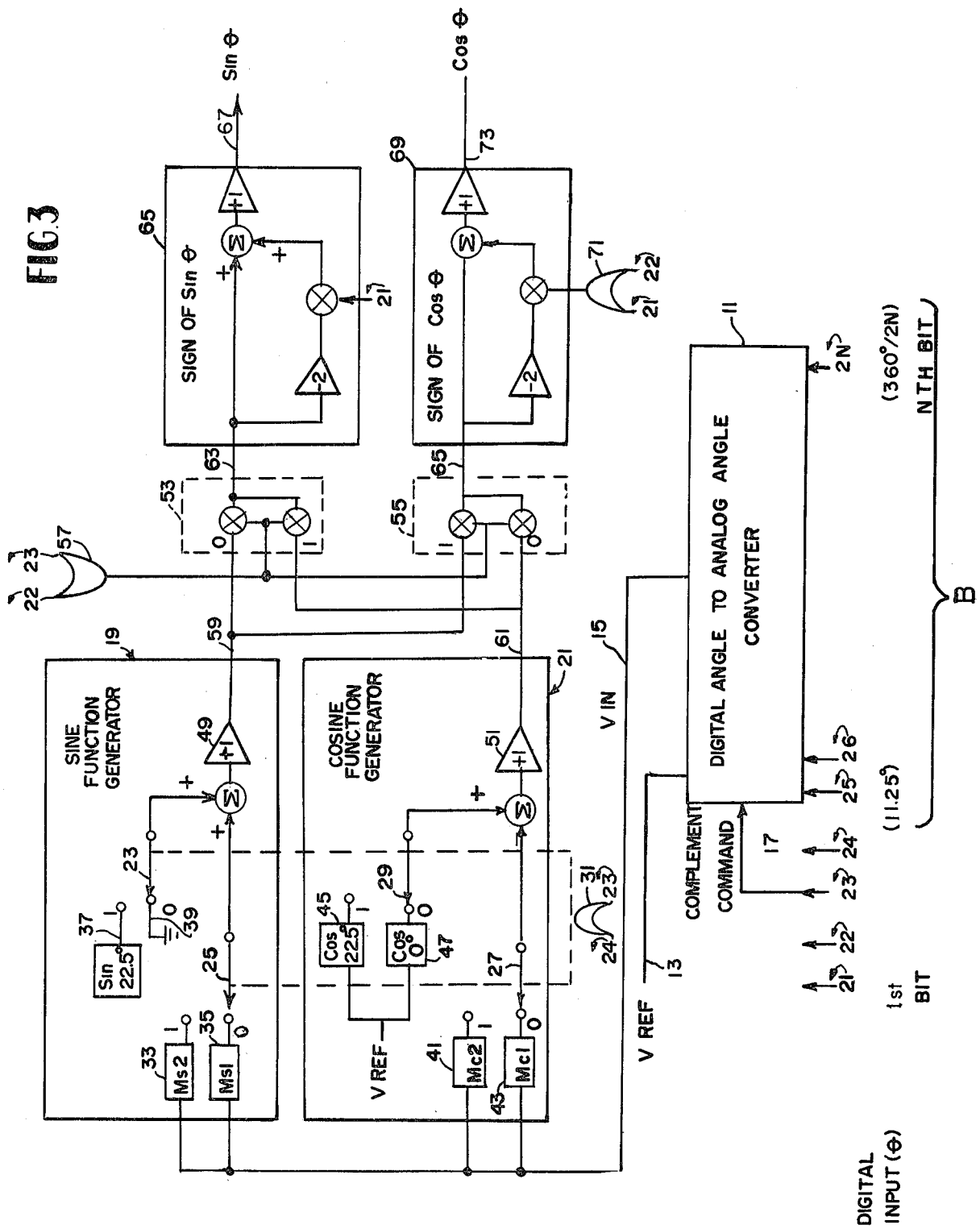

DIGITAL TO ANALOG RESOLVER CONVERTER

BACKGROUND AND PRIOR ART

This invention relates to digital to analog converters in general and more particularly to an improved digital to analog resolver converter.

A digital signal consisting of $n$ bits can be used to represent the magnitude of an angle in radians or degrees, with the least significant bit representing $360/2^n$ degrees or $2\pi/2^n$ radians. To simplify the discussion of the invention, all values will be stated in degrees, since radians can easily be substituted for degrees.

The n-bit digital signal representing the magnitude of an angle can be described by the notation $2^1 2^2 \ldots 2^n$. Throughout this disclosure, the most significant bit (2) will be referred to as the first bit, the second most significant bit ($2^2$) as the second bit, and so forth, down to the least significant ($2^n$) or $n$th bit.

It is evident that the less significant bits of the digital input signal only represent the magnitude of the angle over a given range of angular values. For example, the fifth through $n$th bits represent a range of angular values from 0° to 22.5° – $360/2^{n°}$.

The prior art includes devices capable of converting a digital signal representing the magnitude of an angle to an analog signal representing the magnitude of the angle. These devices use switching networks to control the output of R-2R resistance ladders and generate an analog signal proportional to the digital input signal. One such device suitable for use in this invention is the AD7520, manufactured by Analog Devices.

Prior art devices also exist which generate analog resolver functions corresponding to digital inputs. One type of device utilizes a digital sensor and digital to analog converter to provide a proportional error signal to a servomechanism control shaft which positions an electromechanical resolver device to generate an output. Resolver functions can also be generated by two ladder networks or a multiplexed single ladder. Some solid state devices use programmed memory devices ("look up tables") to convert a digital angle signal to digital sine and cosine signals to generate a resolver function. Other solid state devices convert digital angle values to analog tangent angle values utilizing non-linear resistance networks. These tangent angle values are related to the reference voltage in a manner similar to a resolver function output.

All of these devices have serious disadvantages. The use of servomechanisms for digital to resolver conversions entails substantial cost, size, weight, accuracy and life disadvantages. The two ladder method involves use of an additional ladder and creates problems in tracking accuracy of the two ladders when the temperature changes. The open multiplexed single ladder needs additional circuitry for the multiplex function, involves additional phase lag errors proportional to the ratio of the multiplex frequency to the carrier frequency, and creates variations in scale factor as a function of angle. Solid state digital angle to resolver converters with "look-up tables" use too many discrete parts to achieve acceptable accuracy. Digital angle to tangent angle conversion devices have difficulty in accurately approximating the tangent function with non-linear analog means.

SUMMARY OF THE INVENTION

The present invention generates analog sine and cosine values corresponding to a digital signal representing the magnitude of an angle by using chords to approximate the value of these trigonometric functions over a range of at least 45° (an octant) and then uses switching networks to generate the value of the sine and cosine functions over the entire 360° range.

It should be noted that the sine and cosine functions are the only trigonometric functions which are continuous over an entire 360° range of angular values. Thus in this disclosure the term "continuous periodic trigonometric function" will be used to refer to either the sine or cosine function.

By using more chords the accuracy of the approximation over a given range of angular values can be increased as desired. The error in the computation is approximately equal to $0.016L^3$, where L is the length of the chord in radians. For example, if 22.5° chord lengths are used to approximate the sine and cosine functions, the tangent function, which measures resolver performance, can be generated to within 3.3 minutes of arc. The predictable nature of the error allows error biasing, as a function of the fifth bit, which reduces the error of the tangent ratio generated to within 1.8 minutes of arc.

This invention has many advantages over the prior art devices. It uses a single set of electronic switches to control a common ladder network to generate the sine and cosine functions, thereby reducing complexity and cost of the converter, improving reliability, and reducing maintenance.

The invention synthesizes the sine and cosine functions accurately as a ratio (the tangent function) with limiting factors established on the basis of chord length. This allows desired accuracy to be obtained with a minimum of complexity of components and minimum cost and permits a more efficient interface with electromechanical devices.

Briefly, the invention involves the conversion of an $n$-bit digital signal representing the magnitude of an angle ($\theta$) into corresponding analog sine and cosine signals. Bits representing a range of the angular value of at least 22.5° less $360/2^n$ degrees are converted by a conventional device, such as the AD7520 previously mentioned, into a corresponding analog angle value. This analog value is applied to sine and cosine function generators, which use the equations of one or more chords to approximate these trigonometric functions over the range of the digital angle value. Values of higher order bits are used to choose the appropriate chord equation to generate the sine or cosine value corresponding to the analog angle value. These sine and cosine values are then applied to circuits which select the appropriate sine and cosine values for use as the value of sine $\theta$ and cosine $\theta$ for a given $\theta$. The values of sine and cosine $\theta$ are each applied to a circuit which generates the appropriate sign for sine $\theta$ or cosine $\theta$ for a given $\theta$.

In a preferred embodiment of the invention all bits of the $n$ bit digital signal representing the magnitude of an angle ($\theta$) from the fifth bit to the $n$th bit, representing an angle magnitude (B) from 0° up to 22.5°, are applied to a conventional digital to analog converter consisting, for example, of electronic switches controlling an R-2R ladder, as previously described. In odd numbered octants (e.g., 0° to 45°) a voltage is generated equal to VREF × B/22.5°, where VREF is a reference voltage. The output of the digital angle to analog angle converter is applied to sine and cosine function generators. Each of these function generators approximates the value of a trigonometric function over 45° by using two chords. For the sine function generator, the equation for the first chord (0° to 22.5°) is $Y_{s1} = $ VREF $(B/22.5°) M_{s1}$, where $M_{s1} = 0.3827$. The equation for the second chord (22.5° to 45°) is $Y_{s2} = $ VREF $((B/22.5°) M_{s2} + \sin 22.5°)$, where $M_{s2} = 0.3244$. For the cosine generator the equation for the first chord (0° to 22.5°) is $Y_{c1} = $ VREF $(1 - (B/22.5°) m_{c1})$, where $M_{c1} = 0.0761$. The equation for the second chord is $Y_{c2} = $ VREF $(\cos 22.5° - (B/22.5°) M_{c2})$, where $M_{c2} = 0.2168$.

In even numbered octants (e.g. 45° to 90°), the third bit is used as a complement command to generate the voltage VREF $(1 - B/22.5°)$. This voltage is then fed into the sine and cosine generators. The sine function is approximated over the first 22.5° of the octant by a chord with the equation $Y_{s2} = $ VREF $((1 - B/22.5°) M_{s2} + \sin 22.5°)$, where $M_{s2} = 0.3244$. The sine function is approximated over the second 22.5° of the octant by a chord with the equation $Y_{s1} = $ VREF $(1 - B/22.5°) M_{s1}$, where $M_{s1} = 0.3827$. The cosine function is approximated over the first 22.5° of the octant by a chord with the equation $Y_{c2} = $ VREF $(\cos 22.5° - (1 - B/22.5°) m_{c2})$, where $M_{c2} = 0.2168$. The cosine function is approximated over the second 22.5° of the octant by a chord with the equation $Y_{c1} = $ VREF $(1 - (1 - B/22.5°) M_{c1})$, where $M_{c1} = 0.0761$.

The outputs of the sine and cosine function generators are fed into octant select circuits which use the first and second bit to select the appropriate function generator output to use as sine $\theta$ and cosine $\theta$ in a particular octant. The sine $\theta$ output is fed into a sign of sine generator which uses the first bit to determine the correct sign for sine $\theta$. The cosine $\theta$ output is fed into a sign of cosine $\theta$ generator which uses the first and second bit to generate the correct sign for cosine $\theta$.

BRIEF DESCRIPTION OF THE DRAWINGS

FIG. 2 is a table showing the choice of function generator outputs and signs to generate the sine and cosine functions over a 360° range.

FIG. 3 is a diagram of the preferred embodiment of the invention.

DETAILED DESCRIPTION OF FIGS. 1, 3 AND 4

Figure 1A:
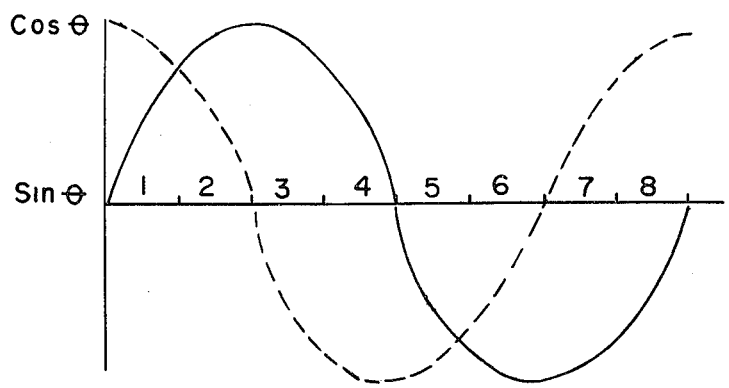
FIG. 1 illustrates the use of two chords according to this invention to approximate the sine and cosine functions over a 45° range (one octant).

FIG. 1 (a) shows the values of the sine and cosine functions over a 360° range. This 360° range is subdivided into four "odd numbered octants" (I, III, V, and VII) and four "even numbered octants" (II, IV, VI, and VIII).

FIG. 1 (b) shows the use of two chords to approximate the sine and cosine functions in an odd numbered octant (I). The equation for the chord representing the sine function from 0° to 22.5° is:

$Y_{s1} = $ VREF $(B/22.5°) M_{s1}$, where $M_{s1} = 0.3827$, and where $0 \leq B \leq 22.5° - 360°/2^n$. The equation for the chord representing the sine function from 22.5° to 45° is:

$Y_{s2} = $ VREF $((B/22.5°) M_{s2} + \sin 22.5°)$, where $M_{s2} = 0.3244$. The equation for the chord representing the cosine function from 0° to 22.5° is:

$Y_{c1} = $ VREF $(1 - B/22.5°) M_{c1})$, where $M_{c1} = 0.0751$. The equation for the chord representing the cosine function from 22.5° to 44.5° is:

$Y_{c2} = $ VREF $(\cos. 22.5° - (B/22.5°) M_{c2})$, where $M_{c2} = 0.2168$.

Figure 1B:
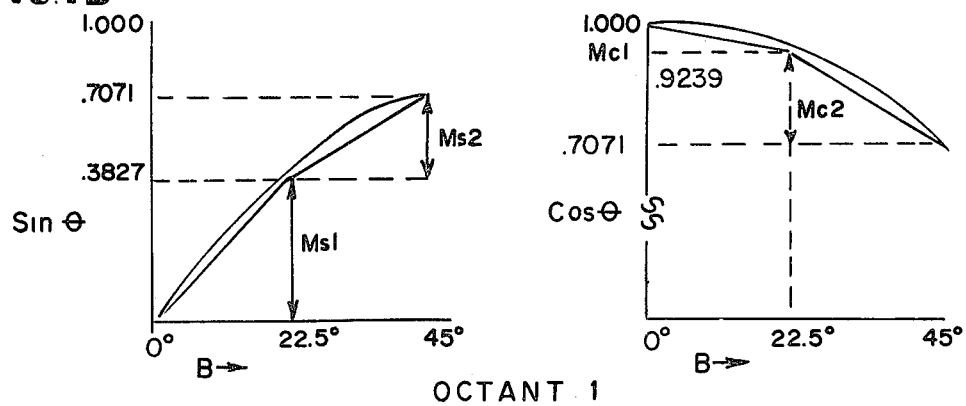
Figure 1C:
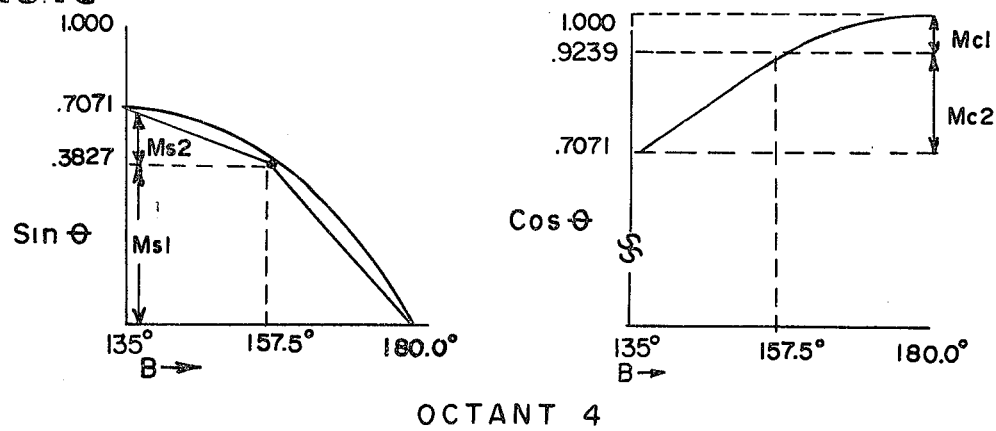

FIG. 1 (c) shows the use of two chords to approximate the values of the sine and cosine functions in an even numbered octant (IV). $M_{c1}$, $M_{c2}$, $M_{s1}$, and $M_{s2}$ have the same values as indicated in FIGS. 1(b) and 1(c). The equation for the sine function from 135° to 157.5° is:

$Y_{s2} = $ VREF $((1 - B/22.5°) M_{s2} + \sin e 22.5°)$. The equation for the sine function from 157.5° to 180° is:

$Y_{s1} = $ VREF $(1 - B/22.5°) M_{s1}$. The equation for the cosine function from 135° to 157.5° is:

$Y_{c2} = $ VREF $(\cos 22.5° - (1 - B/22.5°) M_{c2})$. The equation for the cosine function from 157° to 180° is:

$Y_{c1} = $ VREF $(1 - (1 - B/22.5°) M_{c1})$.

FIG. 2 shows how the output of the function generators can be used to generate an approximation of a continuous periodic trigonometric function over a 360° range of values. The 360° range of angular values is divided in four "even numbered octants" (II, IV, VI and VIII) and four "odd-numbered octants" (I, III, V, and VII). For a given octant, FIG. 2 shows whether or not the function generator input is complemented, which function generator output is used to approximate the sine and cosine functions, and the sign of the sine and cosine outputs.

FIG. 3 shows a preferred embodiment of the invention. The electronic gates such as gate 31 shown in FIG. 3 are all Exclusive Or gates, which have an output value of "0" when both input values are "0" or both input values are "1", and an output value of "1" otherwise. The digital input represents the magnitude of the angle $\theta$. The fifth through $n$th bits, representing the magnitude of the angle B are fed into a conventional digital to analog angle converter 11. A reference voltage (VREF) 13 at 400 hz. is also fed into the converter 11. The output 15 of the converter, which represents either VREF $(B/22.5°)$ or VREF $(1 - B/22.5°)$, depending on the value of the complement command 17, is fed into the sine function generator 19 and cosine function generator 21. Analog switches (preferably RCA Co4053 CMOSFETs) 23, 25, 27 and 29 controlled by an Exclusive Or gate 31 are used to select the appropriate sine function generator slopes 33 and 35, sine function generator intercepts 37 and 39, cosine function generator slopes 41 and 43, and cosine generator intercepts 45 and 47 for the approximating chords. As will be appreciated by those skilled in the art of electronic circuit design, these analog switches (such as switches 23 and 53) connect the "0" analog input to the output when the control input has a "0" value and the "1" analog input to the output when the control input has a "1" value. The sine function generator slope 33 or 35 and intercept 37 or 39 values are summed at amplifier 49. The cosine function generator slope 41 or 43 is subtracted from the intercept 45 or 47 at amplifier 51. Octant select circuits 53 and 55 controlled by an Exclusive Or gate 57 choose which of the sine generator output 59 and cosine generator output 61 will be used as the sine $\theta$ output 63 and cosine $\theta$ output 65 in a particular octant. FIG. 2 shows which output is chosen by the octant select circuits to approximate sine $\theta$ and cosine $\theta$ in each octant. A sign of sine θ circuit 65 controlled by the first bit gives the sine θ output 63 the appropriate sign to produce sine θ on line 67. A sign of cosine θ circuit 69 controlled by an Exclusive Or gate 71 gives the cosine θ output 65 the appropriate sign to generate cosine θ on line 73. The sign of sine and cosine θ circuits shown in FIG. 3 operate by subtracting twice the value of the function from the value of the function when the value of the controlling input is "1". It will be recognized by those skilled in the art of electronic circuit design that the appropriate sign can also be given to sine or cosine θ by using the controlling input to switch the sine or cosine θ input between inverting and non-inverting inputs of an amplifier.

Figure 4:
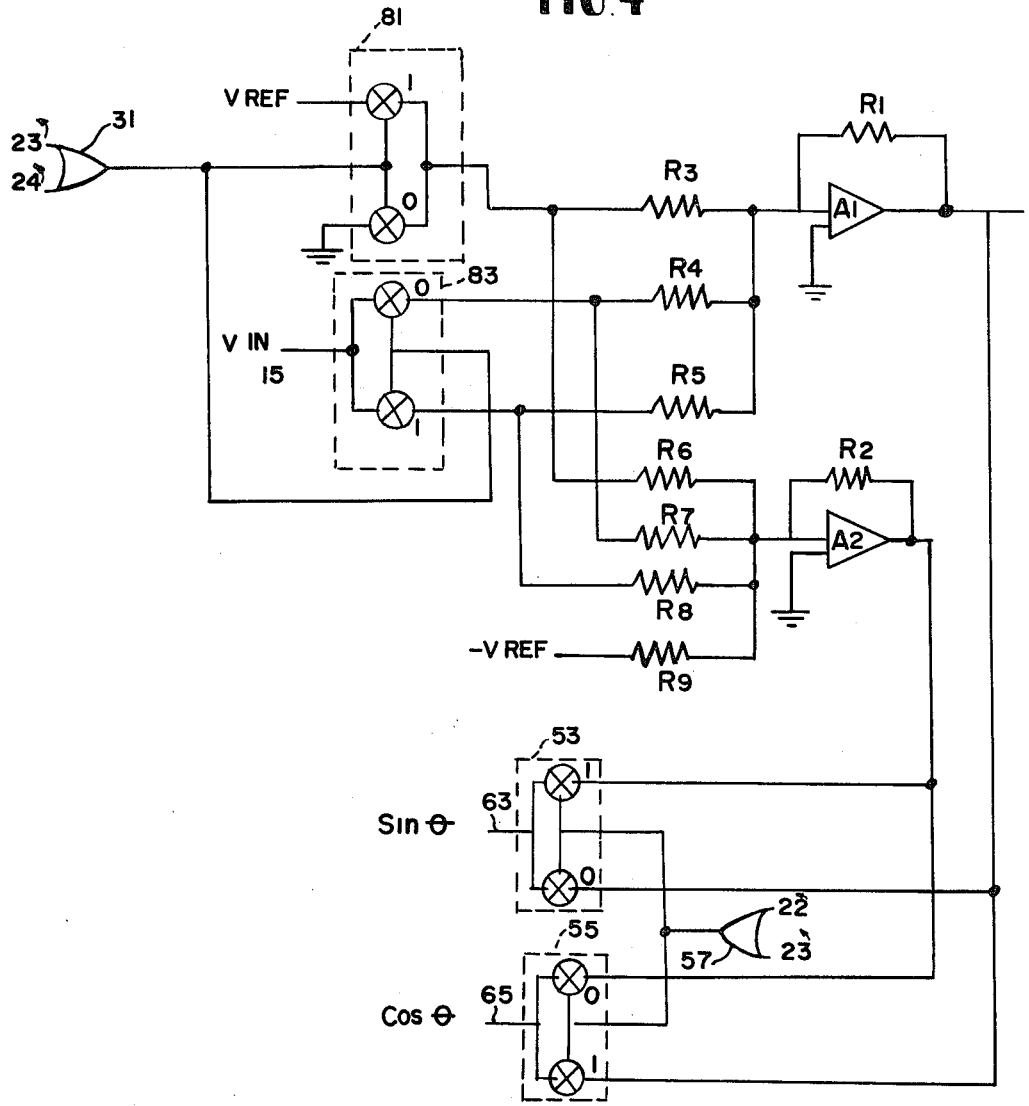
FIG. 4 is a detailed diagram of the sine and cosine function generator used in the preferred embodiment.

FIG. 4 illustrates one embodiment of the sine and cosine function generators and octant select circuit. VREF is the reference voltage with a frequency of 400 hz. The resistors have the following values:

| | |
|---|---|
| R1 | 90K, |
| R2 | 20K, |
| R3 | 235.004K, |
| R4 | 235.004K, |
| R5 | 227.029K, |
| R6 | 262.542K, |
| R7 | 262.542K, |
| R8 | 92.137K, and |
| R9 | 20K |

Exclusive Or gate 31 controls switch 81 to select either VREF or ground as an input to resistor $R_3$, which corresponds to sine 22.5°, and resistor $R_6$, which corresponds to cosine 22.5°. Thus $R_3/R_1 = 0.3827 =$ sine 22.5°. Exclusive Or gate 31 also controls switch 83 to switch VIN, which is the output of the digital to analog converter on line 15, to either $R_4$ (corresponding to $M_{s1}$) and $R_7$ (corresponding to $M_{c1}$), or to $R_5$ (corresponding to $M_{s2}$) and $R_8$ (corresponding to $M_{c2}$). $R_9$ corresponds to cosine 0°. Amplifier A1 then generates the sine function and amplfier A2 generates the cosine function. Switch 53 selects the correct function for use as sine θ and Switch 55 selects the correct function for use as cosine θ in accordance with FIG. 2 as described above.

Other embodiments of the basic invention are possible. By changing to more convenient chord lengths and appropriate scaling of resistor networks inputs in binary coded decimal and other codes may be converted to resolver functions. The intercepts and slopes of chords may be shared or duplicated when repeated to minimize the number of switching components. Chords may be used to approximate the trigonometric functions through a range of 90°, eliminating the need for complementing the analog angle output. The invention may be combined with storage registers or shift registers to accommodate serial digital data. The invention may be coupled with output power amplifiers to interface with high power load demands.

The invention may be coupled with isolation transformers to generate isolated resolver analog outputs over a wide range of voltages. The invention may be combined with a Scott "T" transformer to generate isolated synchro analog outputs at a wide range of line to line voltages. The invention may include multiplexing circuitry, sample and hold amplifiers, and output stages in order to generate multiple resolver and/or synchro analog voltages corresponding to multiple input digital words. Finally, the invention is capable of interfacing directly with state of the art digital hardware, i.e., DTL, TTL, CMOS. These and other modifications may be made without departing from the spirit of the invention which is intended to be limited solely by the appended claims.

We claim:

1. A method utilizing electronic circuitry for converting an $m$ bit digital voltage signal representing an angle over an octant, which is a portion of an $n$ bit digital voltage signal representing the angle from 0° to 360°, into an analog voltage signal representing a continuous periodic function of the angle to be used as an output of a digital to analog resolver converter, comprising:
   (a) dividing the continuous periodic function of the angle into an even number $p$ of equal angular segments, each segment having a slope with the same sign over the full segment;
   (b) determining and storing the average slope of each segment and the intercept of each slope segment in the electronic circuitry;
   (c) converting the $r$ least significant bits of the digital signal into an analog value in a digital to analog converter where $r$ is equal to $m - \log_2 p$;
   (d) selecting in said electronic circuitry a slope and intercept in accordance with the remaining $\log_2 p$ bits of the $m$ bit digital voltage signal and the $(m+1)$th bit; and
   (e) multiplying said analog value by the selected slope and adding to the result the selected intercept in said electronic circuitry.

2. The method of claim 1 wherein said angular segments are segments of 22.5°.

3. The method of claim 2 for generating a sine signal and cosine signal for all angles between 0° and 360° with an $n$ bit digital signal representing the angle between 0 and 360°, where $m$ bits represent an angle increment of 45° and $n$ is equal to $m$ plus 3 the three additional bits being the most significant bits, which comprises:
   converting the fifth to $n$th bits of the digital input signal into an analog output signal;
   complementing the analog output signal if the third bit is present indicating that the angle is in an even-numbered octant;
   storing as first and second sine slope and intercept values the slope and intercept of the sine function for the two segments making up the first octant and as first and second cosine slope and intercept values the slope and intercept of the cosine function for the two segments in the first octant;
   selecting the first sine slope value, first sine intercept value, first cosine slope value, and first cosine intercept value if the third and fourth bits of the digital input signal both have identical values, otherwise selecting the second sine slope value, second sine intercept value, second cosine slope value, and second cosine intercept value;
   multiplying the analog output signal by the selected sine slope value and adding the selected sine intercept value to produce a sine function signal to approximate a sine value corresponding to the analog output signal;
   multiplying the analog output signal by the selected cosine slope value and subtracting the result from the selected cosine intercept value to produce a cosine function signal to approximate a cosine value corresponding to the analog output signal;
   designating the cosine function signal as a cosine output signal and the sine function signal as a sine output signal if the second and third bits of the digital input signal have identical values, otherwise designating the cosine function signal as the sine output signal and the sine function signal as the cosine output signal;

assigning a negative sign to the sine signal if the first bit is not present indicating that the magnitude of the angle is less than 180°, otherwise, if the first bit is present, assigning a positive sign to the sine signal;

assigning a positive sign to the cosine signal if the first and second bits have identical values, otherwise assigning a negative sign to the cosine signal.

4. A device for converting an $m$ bit digital signal representing an angle over an octant, which is a portion of an $n$ bit digital signal representing its angle from 0° to 360°, into an analog signal representing a continuous periodic function of the angle comprising:
 (a) means for storing the slopes of line segments subtending an even number $p$ of equal angular segments which divide the continuous periodic function over the octant and each of which has a slope with the same sign over the full angular segment;
 (b) means for storing the intercepts of said lin segments;
 (c) means for converting the least significant $r$ bits of the digital signal into an analog value where $r$ is equal to $m$-$\log_2 p$;
 (d) means for selecting a slope and intercept of a line segment in accordance with the remaining $\log_2 p$ bits of the $m$ bit digital voltage signal and the $(m+1)$th bit; and
 (e) means for multiplying said analog value by the selected slope value and adding to the result the selected intercept.

5. The device of claim 4, wherein said slope storage means comprises means for storing the slopes of two line segments subtending two equal angular segments representing the value of said periodic function over the octant; and said intercept storage means comprises the means for storing intercepts of the two line segments.

6. The device of claim 5 for generating a sine signal and a cosine signal for all angles between 0° and 360°, where $n$ bits represent an angle between 0° and 360° and $n$ is equal to $m$ plus 3 the three additional bits being the most significant bits, comprising:
 (a) a digital to analog converter for converting the fifth to $n$th bit of the digital analog signal into an analog output signal;
 (b) complement command means for complementing the analog output signal if the third bit is present indicating that the angle is in an even-numbered octant;
 (c) sine storage means for storing as first and second sine slope and intercept values the slope and intercept of the sine function for the two line segments making up the first octant of the sine function;
 (d) cosine storage means for storing as first and second cosine slope and intercept slope and intercept values the slope and intercept of the cosine function for the two line segments in the first octant of the cosine function;
 (e) selection means for selecting the first sine slope and intercept values and first cosine slope and intercept values if the third and fourth bits of the digital input signal have identical values, otherwise selecting the second sine slope and intercept values and the second cosine slope and intercept values;
 (f) sine computation means for multiplying the analog output signal by the selected sine slope value and adding the selected sine intercept value to produce a sine function signal to approximate a sine value corresponding to the analog output signal;
 (g) cosine computation means for multiplying the analog output signal by the selected cosine slope value and subtracting the result from the selected cosine intercept value to produce a cosine function signal to approximate a cosine value corresponding to the analog output signal;
 (h) octant select means for designating the cosine function signal as a cosine output signal and the sine function signal as a sine output signal if the second and third bits of the digital input signal have identical values, otherwise designating the cosine function signal as the sine output signal and the sine function signal as the cosine output signal;
 (i) a sign of sine means for assigning a positive sign to the sine output signal if the first bit is not present indicating the magnitude of the angle is less than 180° and assigning a negative sign otherwise;
 (j) a sign of cosine means for assigning a positive sign to the cosine output signal if the first and second bits are identical, otherwise assigning a negative sign to the cosine output signal.

7. The digital to analog resolver converter of claim 6 wherein said sine computation means comprises a first summing amplifier with an output and an inverting input, and said sine storage means comprises:
 (a) a first resistor connected to the inverting input of the first summing amplifier;
 (b) a second resistor connected to the inverting input of the first summing amplifier;
 (c) a third resistor connected to the inverting input of the first summing amplifier; and
 (d) a first feedback resistor connected to the inverting input and the output of the first summing amplifier and having a ratio to the first resistor equal to the second sine intercept, a ratio to the second resistor equal to the first sine slope, and a ratio to the third resistor equal to the second sine slope.

8. The digital to analog resolver converter of claim 7 wherein said cosine computation means comprises a second summing amplifier with an output and an inverting input, and said cosine storage means comprises:
 (a) a fourth resistor connected to the inverting input of the second summing amplifier;
 (b) a fifth resistor connected to the inverting input of the second summing amplifier;
 (c) a sixth resistor connected to the inverting input of the summing amplifier;
 (d) a seventh resistor connected to the inverting input of the summing amplifier; and
 (e) a second feedback resistor connected to the output and the inverting input of the second summing amplifier and having a ratio to the fifth resistor equal to the first cosine slope, a ratio to the sixth resistor equal to the second cosine slope, a ratio to the seventh resistor equal to the first cosine intercept and a ratio to the fourth resistor equal to the ratio of the second feedback resistor to the seventh resistor less the value of the second cosine intercept.

9. The digital to analog resolver converter of claim 12 wherein said selection means comprises:
 a first analog switch connecting a reference voltage equal to the maximum sine voltage to the second end of the first and fourth resistors when the third and fourth bits of the digital input signal have different values, otherwise connecting the second end of the first and fourth resistors to ground; and a second analog switch connecting the analog output signal to the second end of the second and fifth resistors when the third and fourth bits of the digital input signal have identical values, otherwise connecting the analog output signal to the second end of the third and sixth resistors.

10. The digital to analog resolver of claim 9, wherein the octant select circuit comprises:

(a) a third analog switch connecting the output of the first summing amplifier to a sine output if the second and third bits of the digital input signal have identical values, otherwise connecting an output of the second summing amplifier to the cosine output, and (b) a fourth analog switch connecting the output of the second summing amplifier to a cosine output if the second and third bits of the digital input signal have identical values, otherwise connecting the output of the first summing amplifier to the sine output.

* * * * *